(12) United States Patent
Cheung et al.

(10) Patent No.: US 6,655,045 B2
(45) Date of Patent: Dec. 2, 2003

(54) APPARATUS AND METHOD FOR PICK AND PLACE HANDLING

(75) Inventors: Yiu Ming Cheung, Kwai Chung (HK); Pei Wei Tsai, Kwai Chung (HK); Yu Sze Cheung, Kwai Chung (HK)

(73) Assignee: ASM Assembly Automation Limited, Kwai Chung (HK)

( * ) Notice: Subject to any disclaimer, the term of this patent is extended or adjusted under 35 U.S.C. 154(b) by 104 days.

(21) Appl. No.: 09/920,016

(22) Filed: Aug. 2, 2001

(65) Prior Publication Data

US 2002/0133971 A1 Sep. 26, 2002

Related U.S. Application Data

(63) Continuation-in-part of application No. 09/814,217, filed on Mar. 22, 2001, now abandoned.

(51) Int. Cl.$^7$ .................................................. F26B 5/04
(52) U.S. Cl. .................... 34/406; 414/754; 414/222.04; 83/153; 83/929.1
(58) Field of Search ................................. 414/754, 776, 414/756, 222.04, 150; 83/112, 113, 153, 100, 929.1; 34/406

(56) References Cited

U.S. PATENT DOCUMENTS

| | | | | | |
|---|---|---|---|---|---|
| 4,004,955 | A | * | 1/1977 | Dost et al. | 438/460 |
| 4,046,985 | A | * | 9/1977 | Gates | 219/121.68 |
| 5,347,898 | A | * | 9/1994 | Ito | 83/27 |
| 5,710,065 | A | * | 1/1998 | Alfaro | 225/1 |
| 5,803,797 | A | * | 9/1998 | Piper | 451/182 |
| 6,165,232 | A | | 12/2000 | Tieber et al. | |
| 6,187,654 | B1 | | 2/2001 | Tieber | |

* cited by examiner

*Primary Examiner*—Ira S. Lazarus
*Assistant Examiner*—Kathryn S. O'Malley
(74) *Attorney, Agent, or Firm*—Burns, Doane, Swecker & Mathis, L.L.P.

(57) ABSTRACT

This invention relates to a method and apparatus for pick and place handling of electronic components that have been formed on a common substrate and then separated on a cutting chuck. A transferring means is provided formed with openings for receiving separated components. The opening is defined by walls of which at least one is movable so as to engage the components and hold them in a fixed configuration and orientation while they are moved by a sliding motion through a processing unit and onto a transfer platform for delivery to an output track.

48 Claims, 9 Drawing Sheets

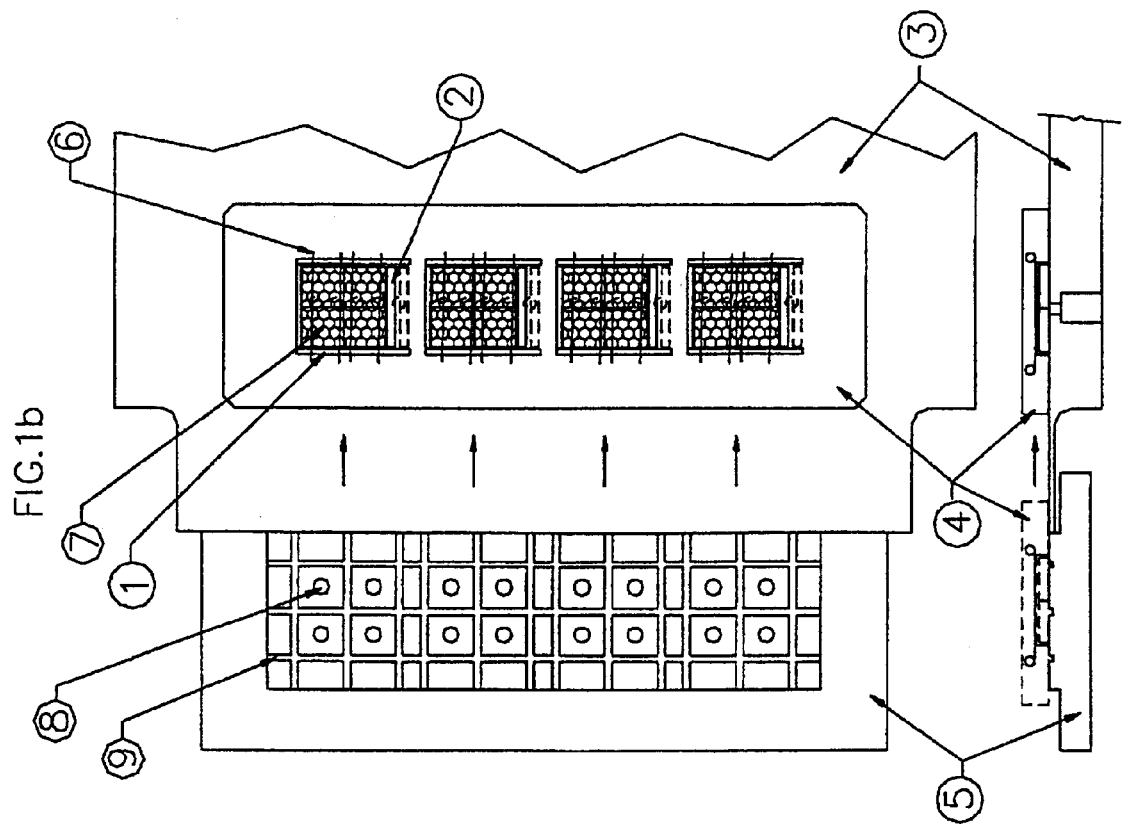
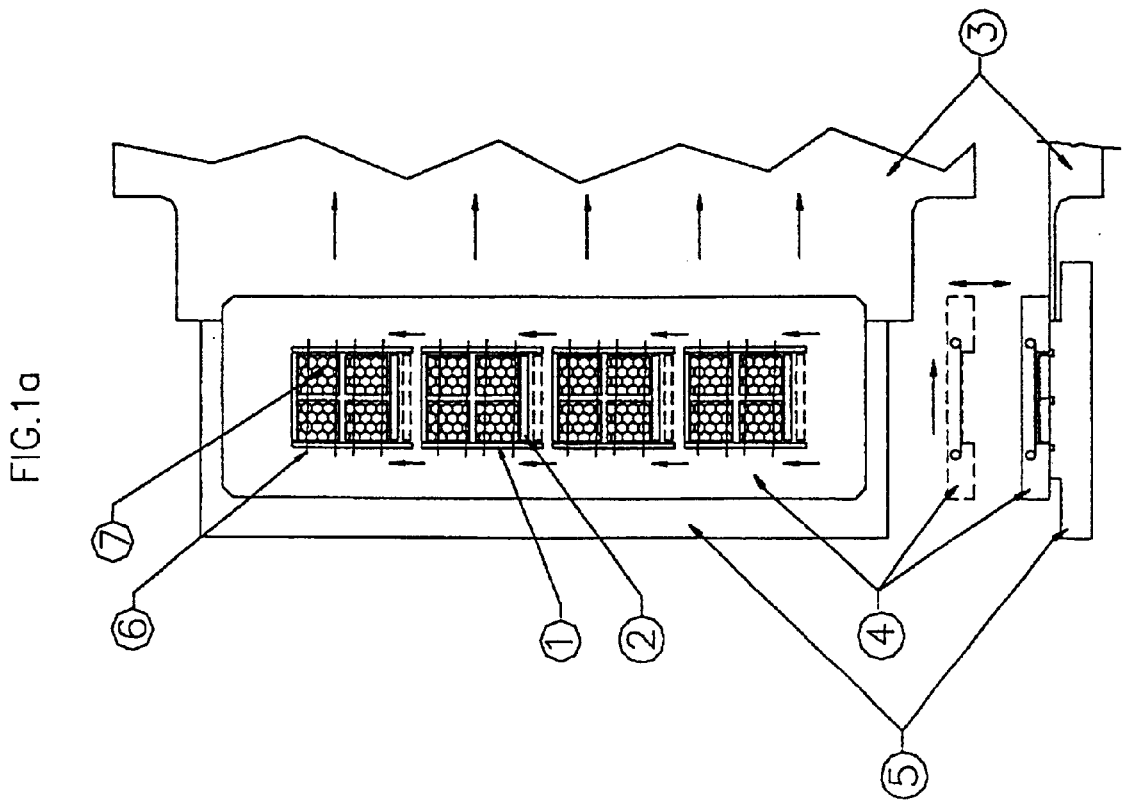

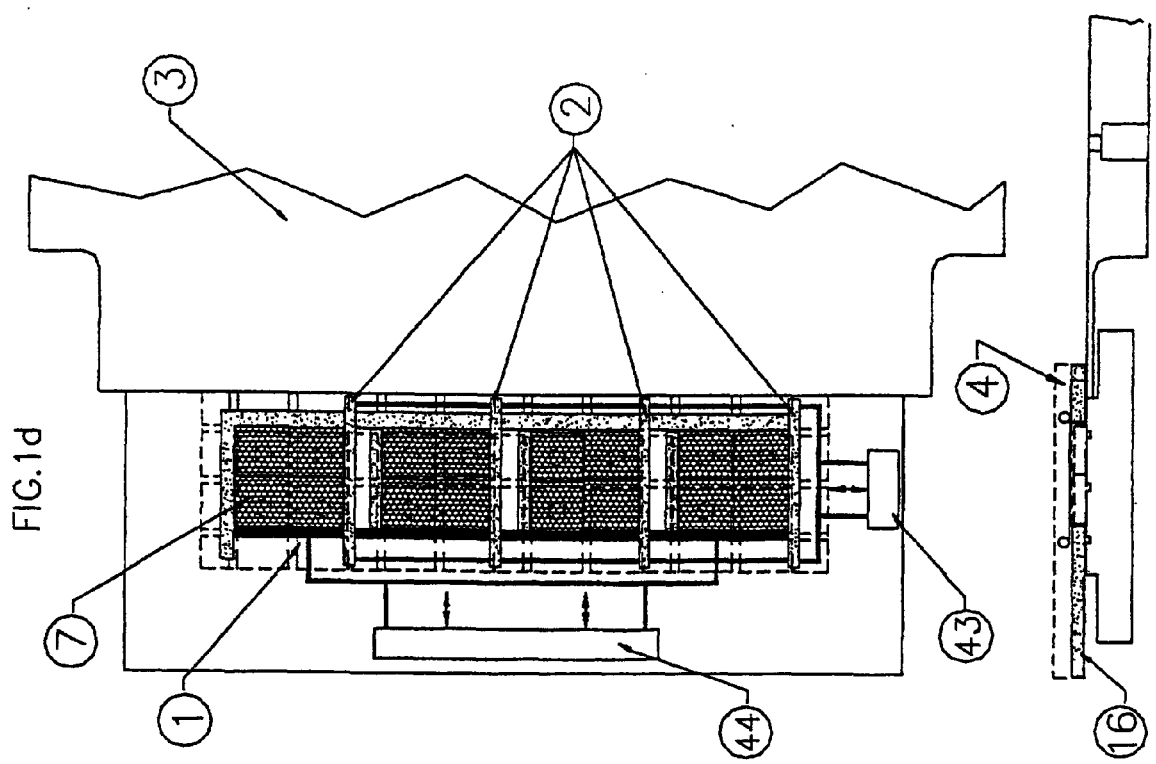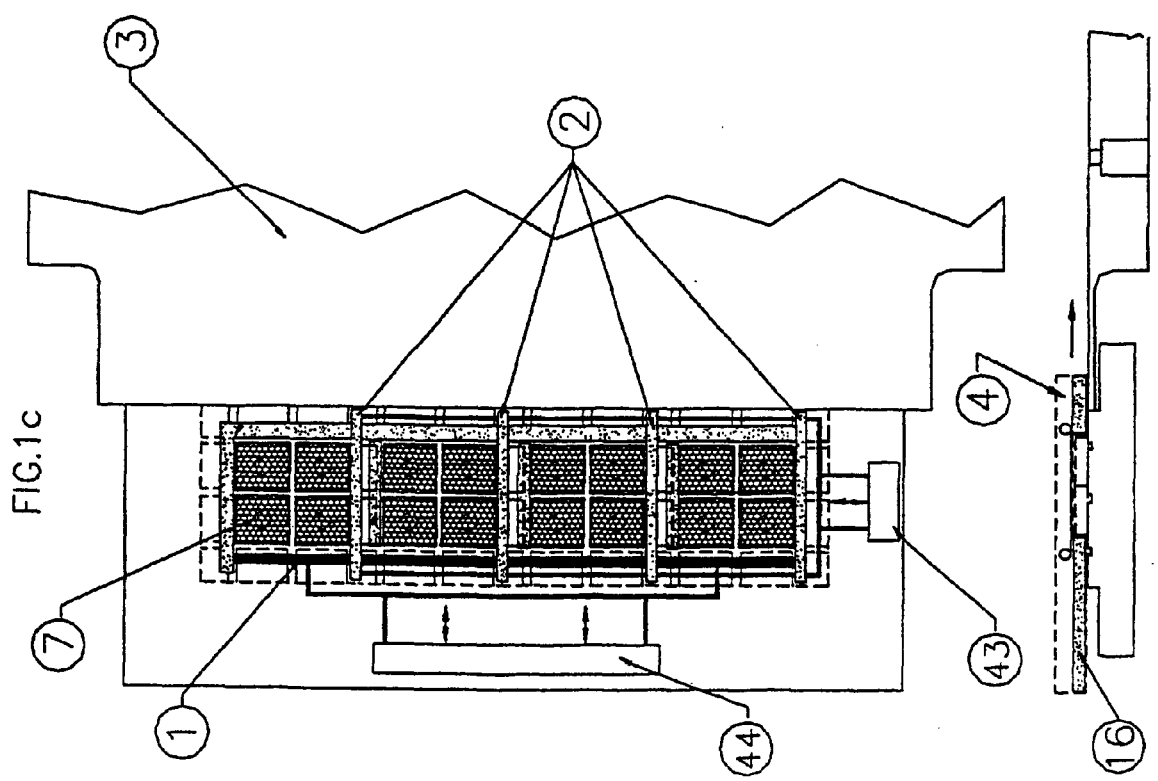

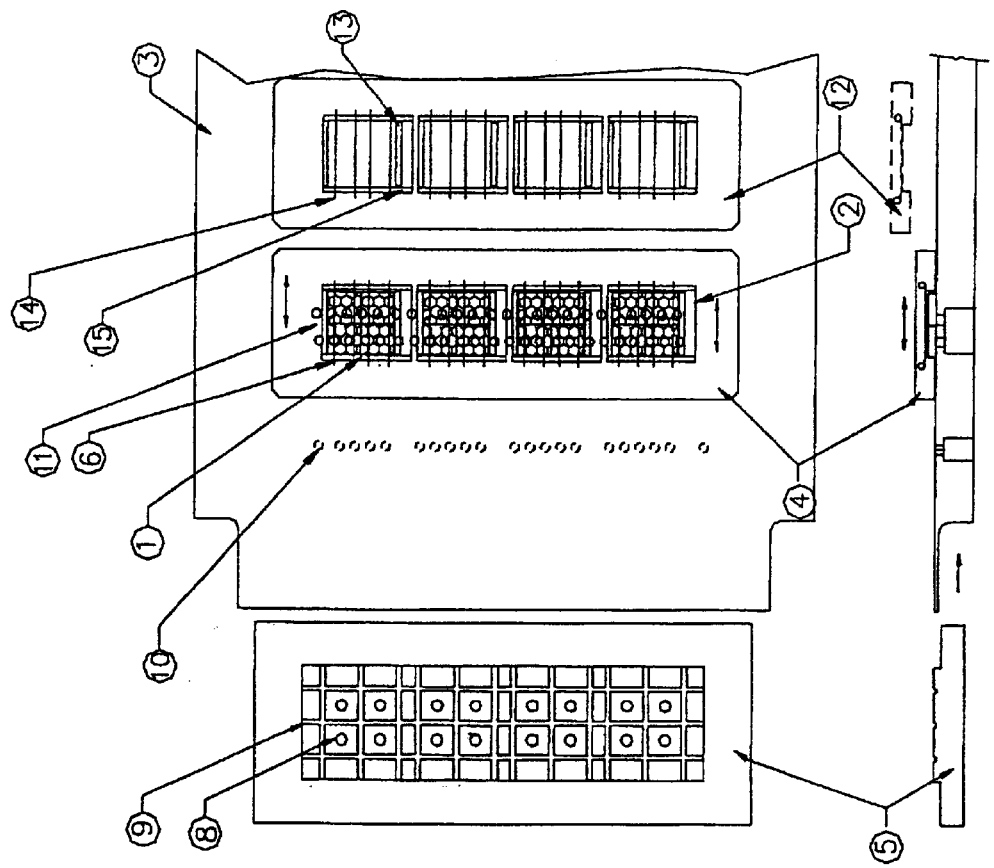
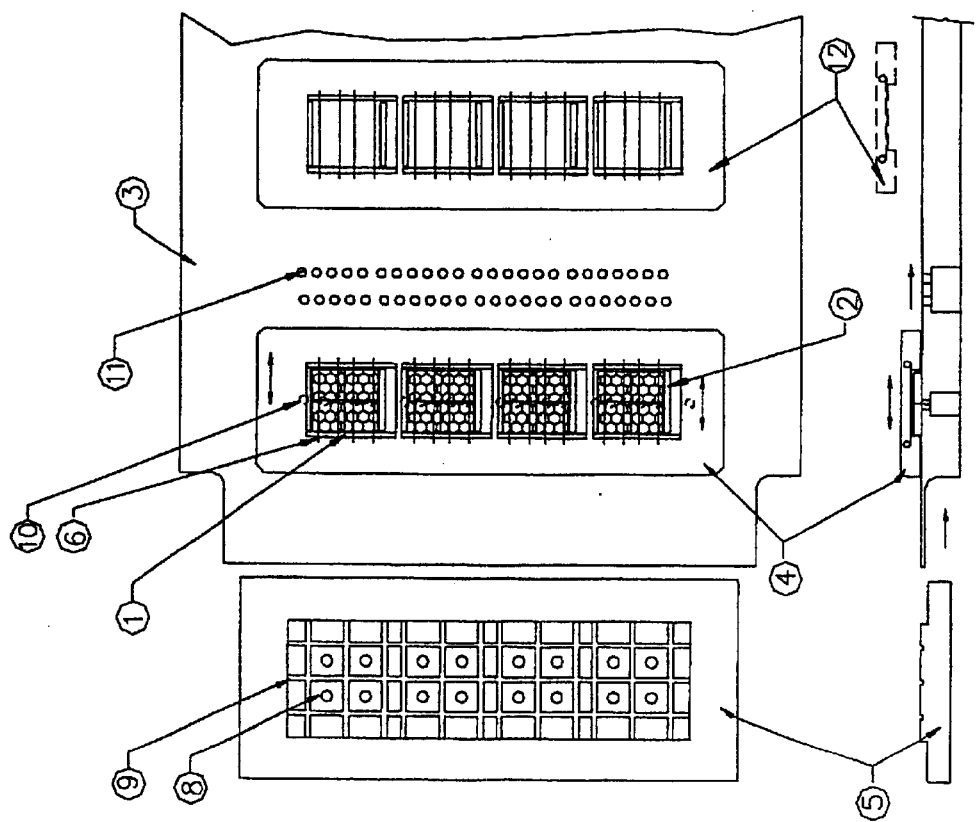
FIG.2b
FIG.2a

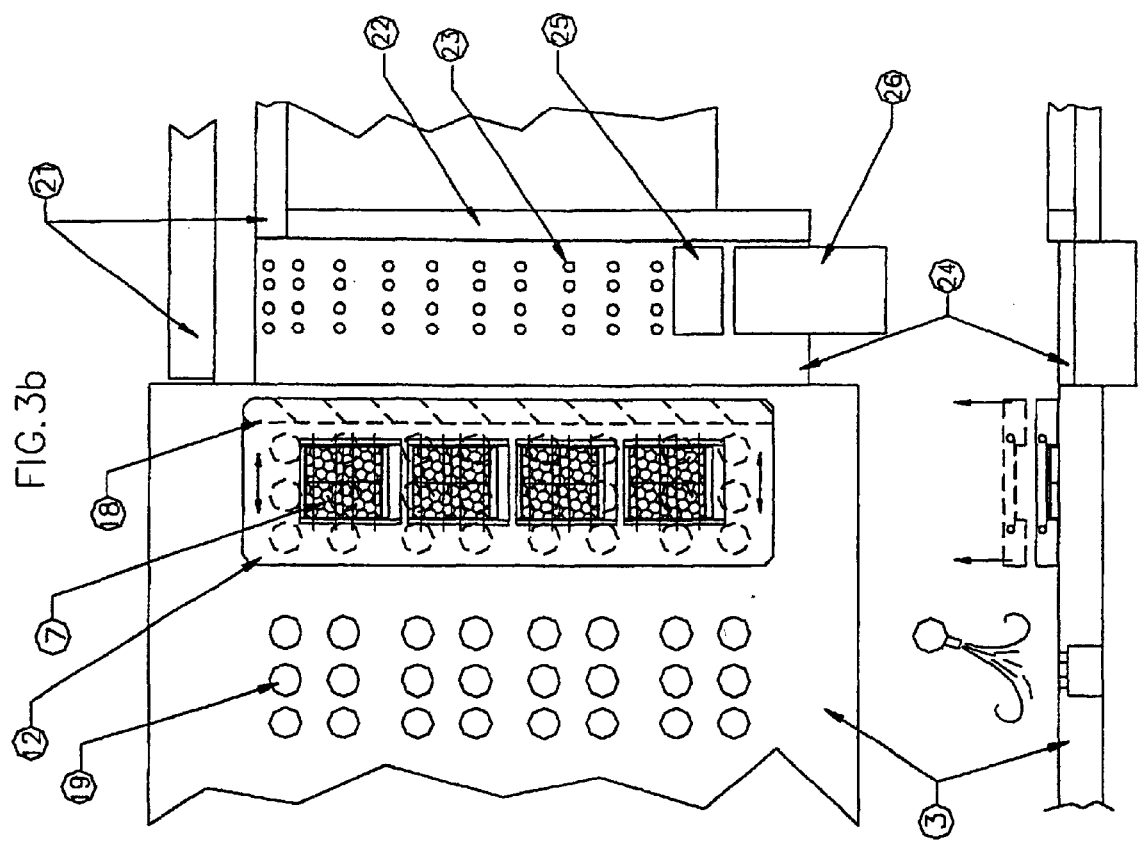
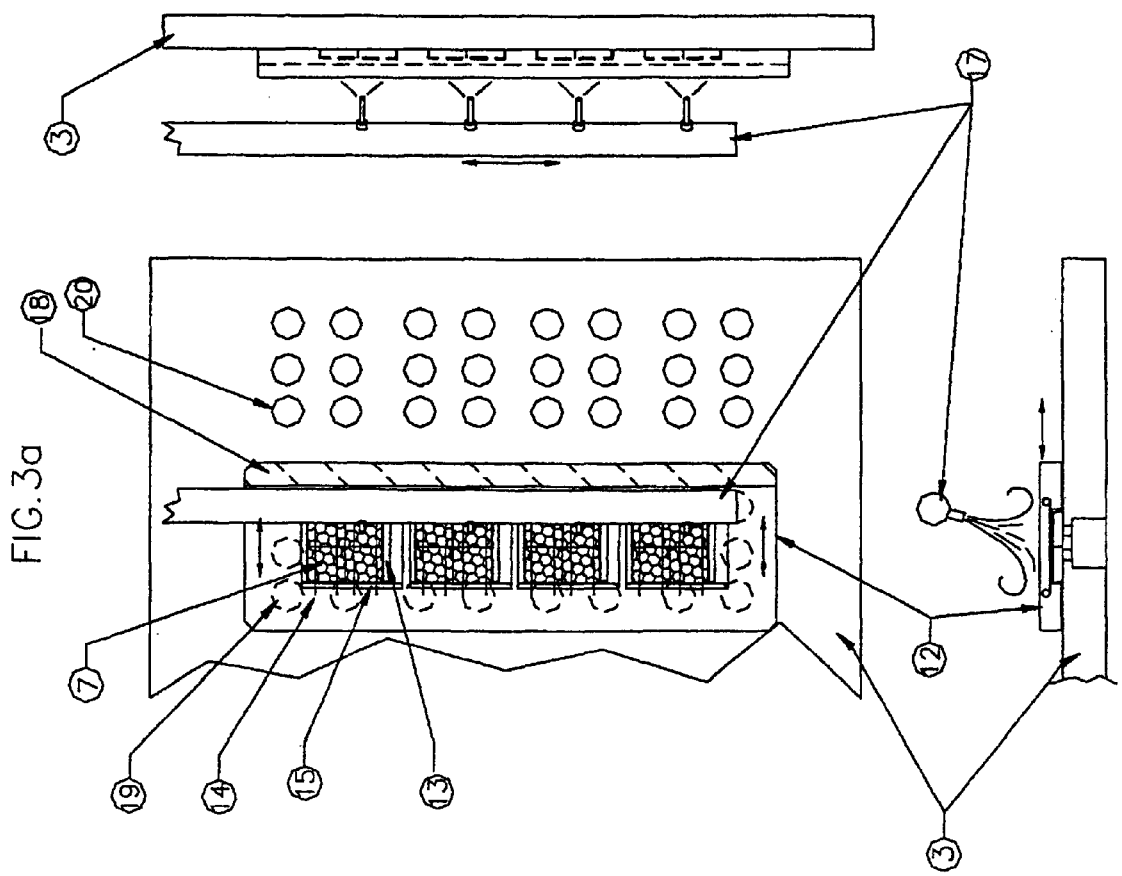

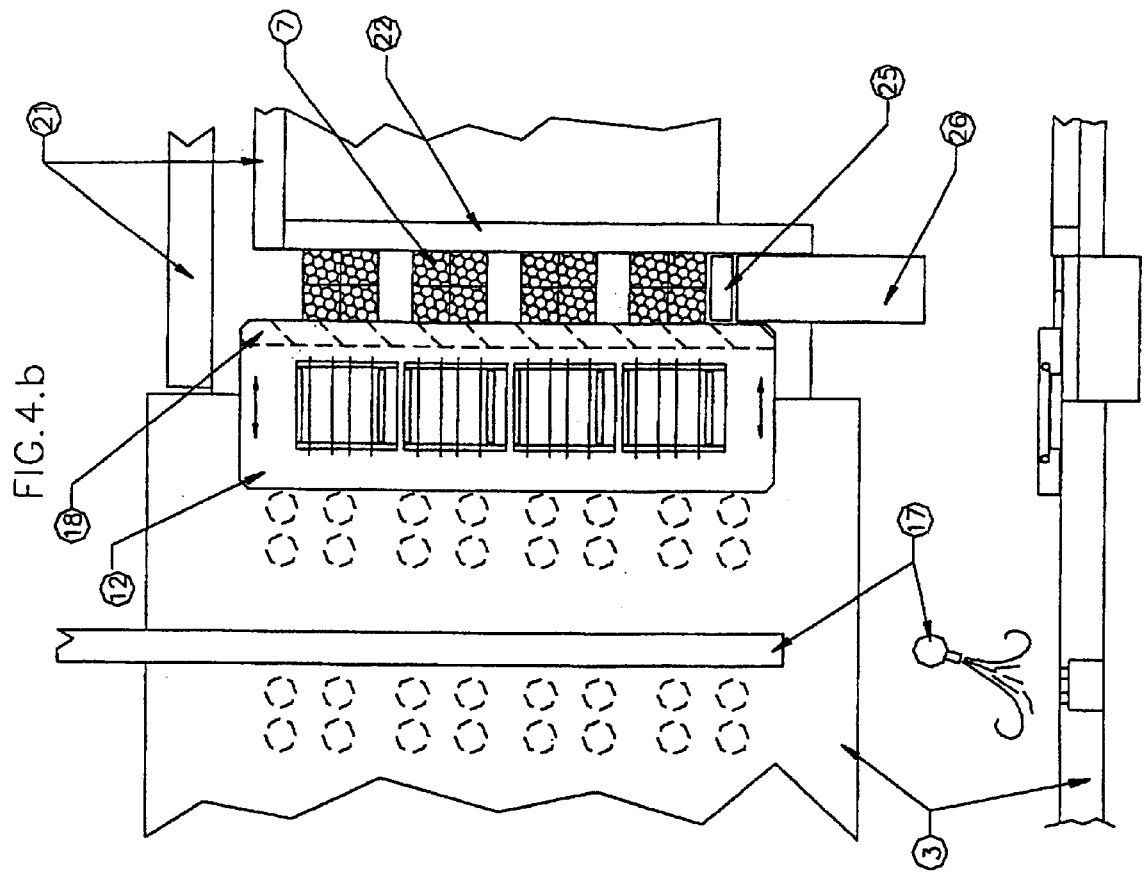
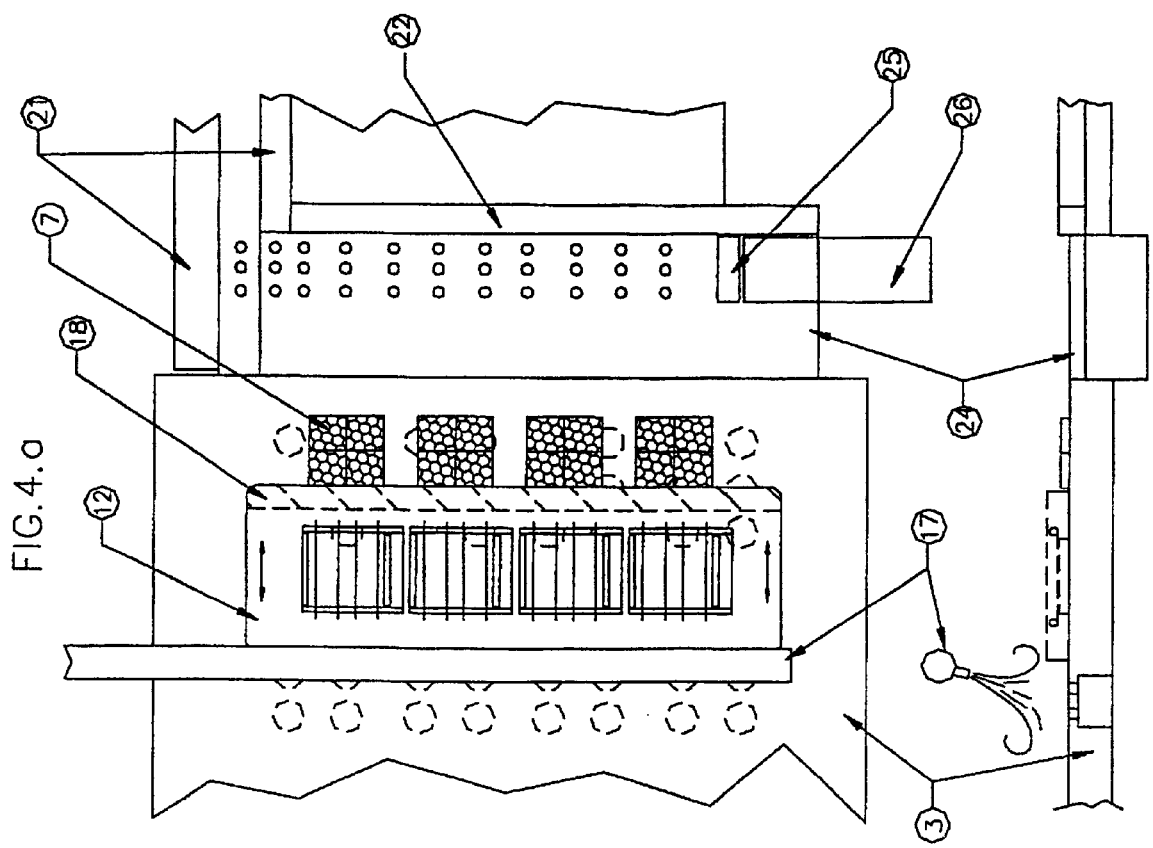

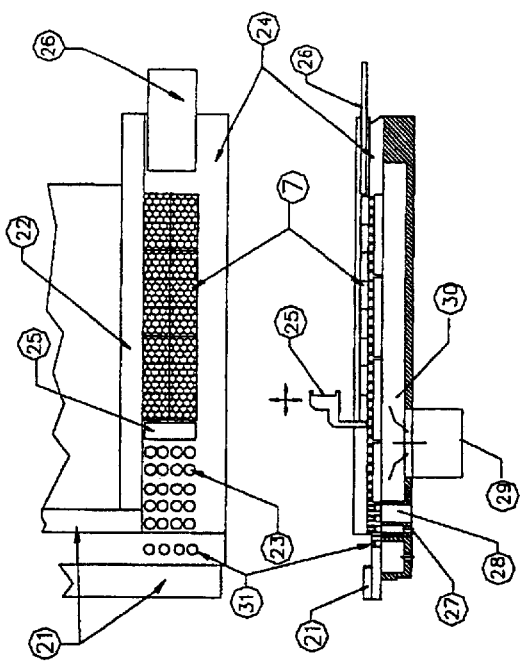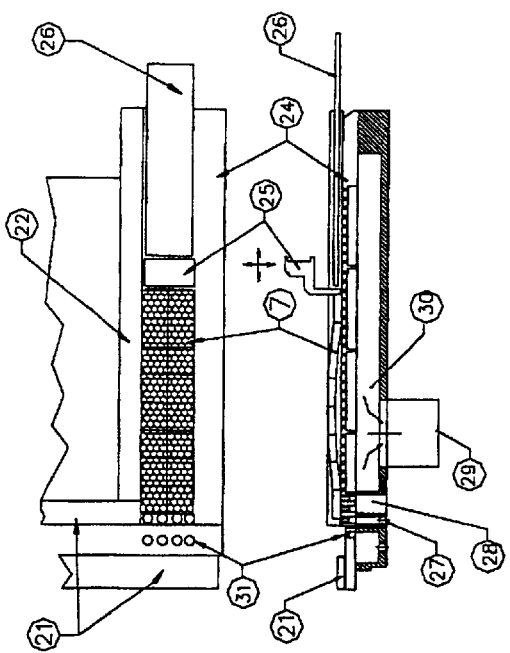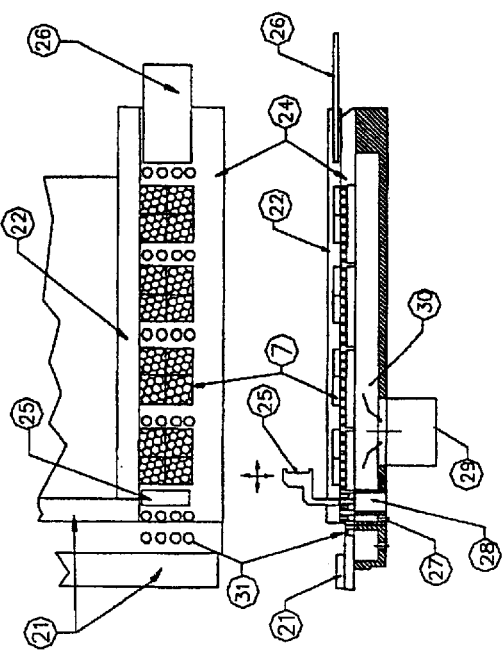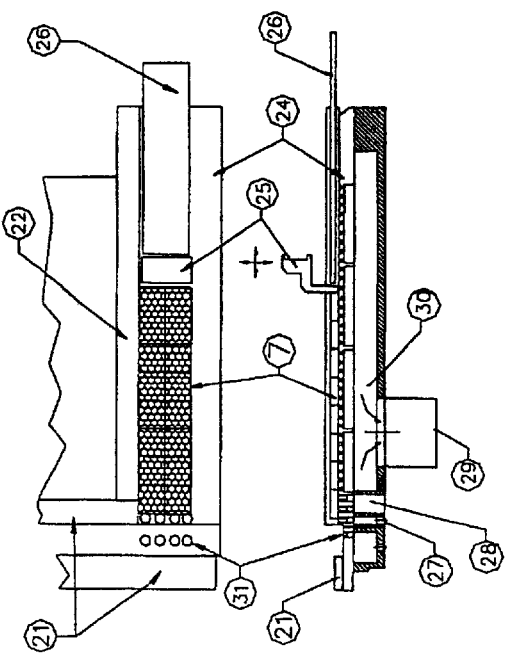

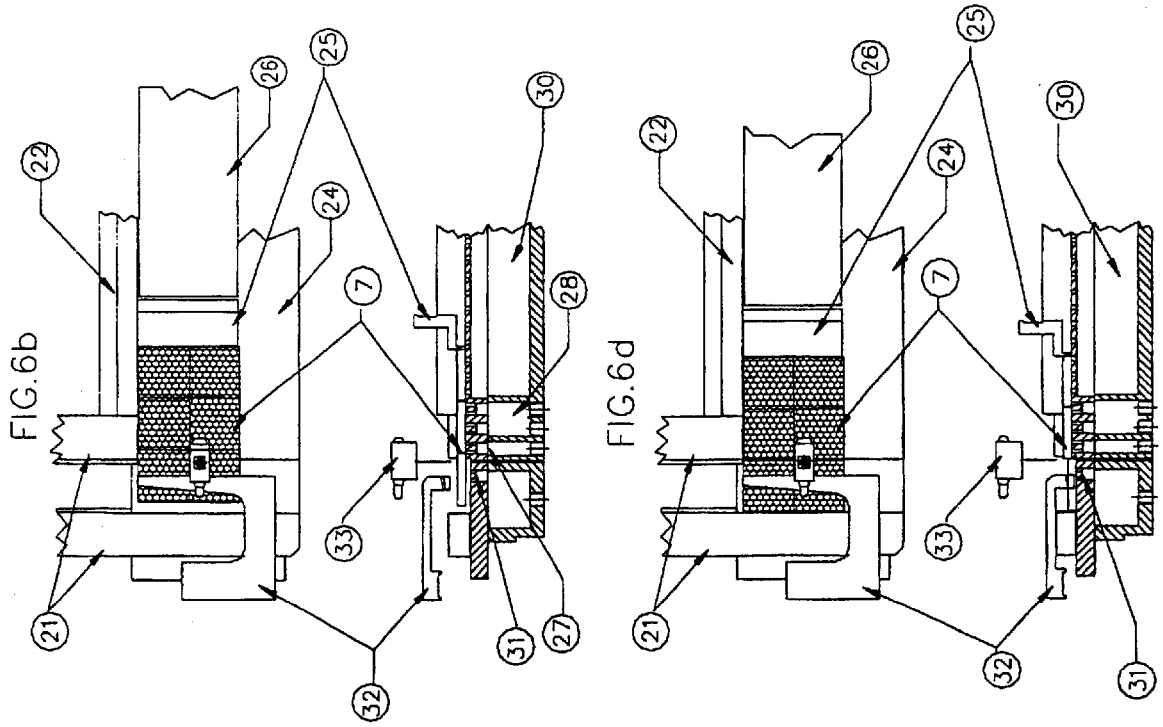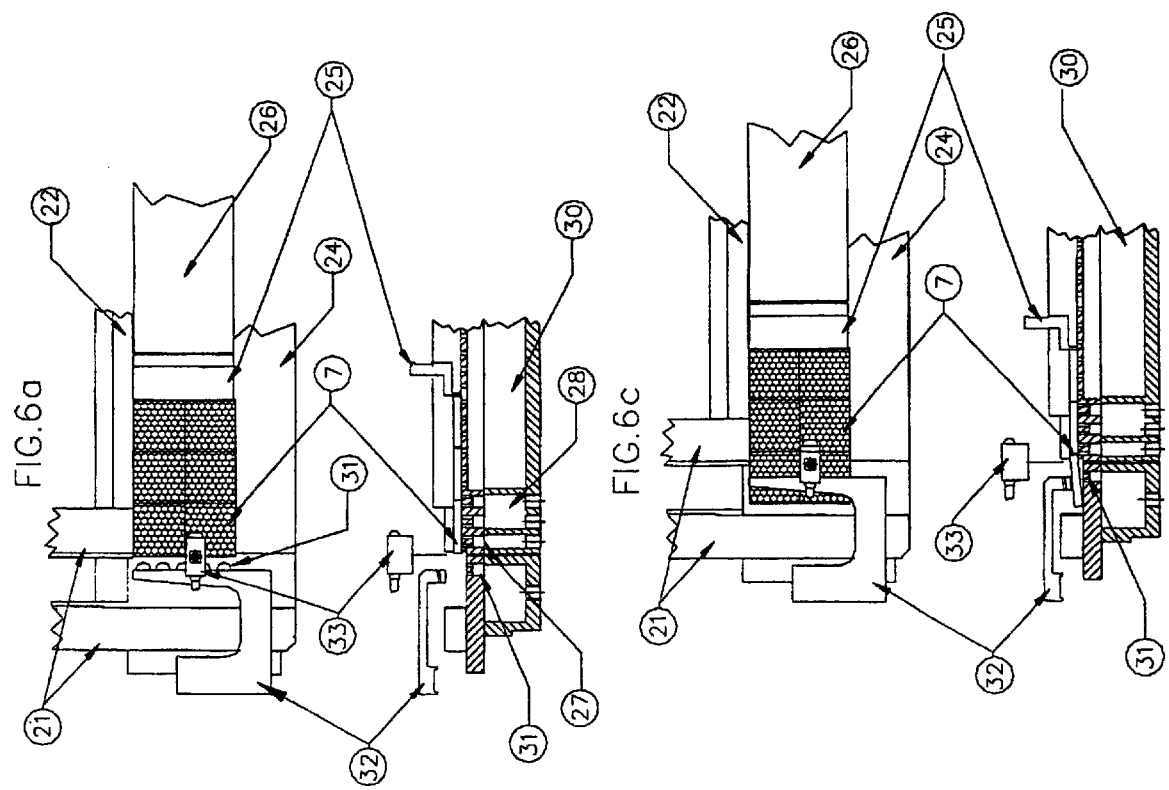

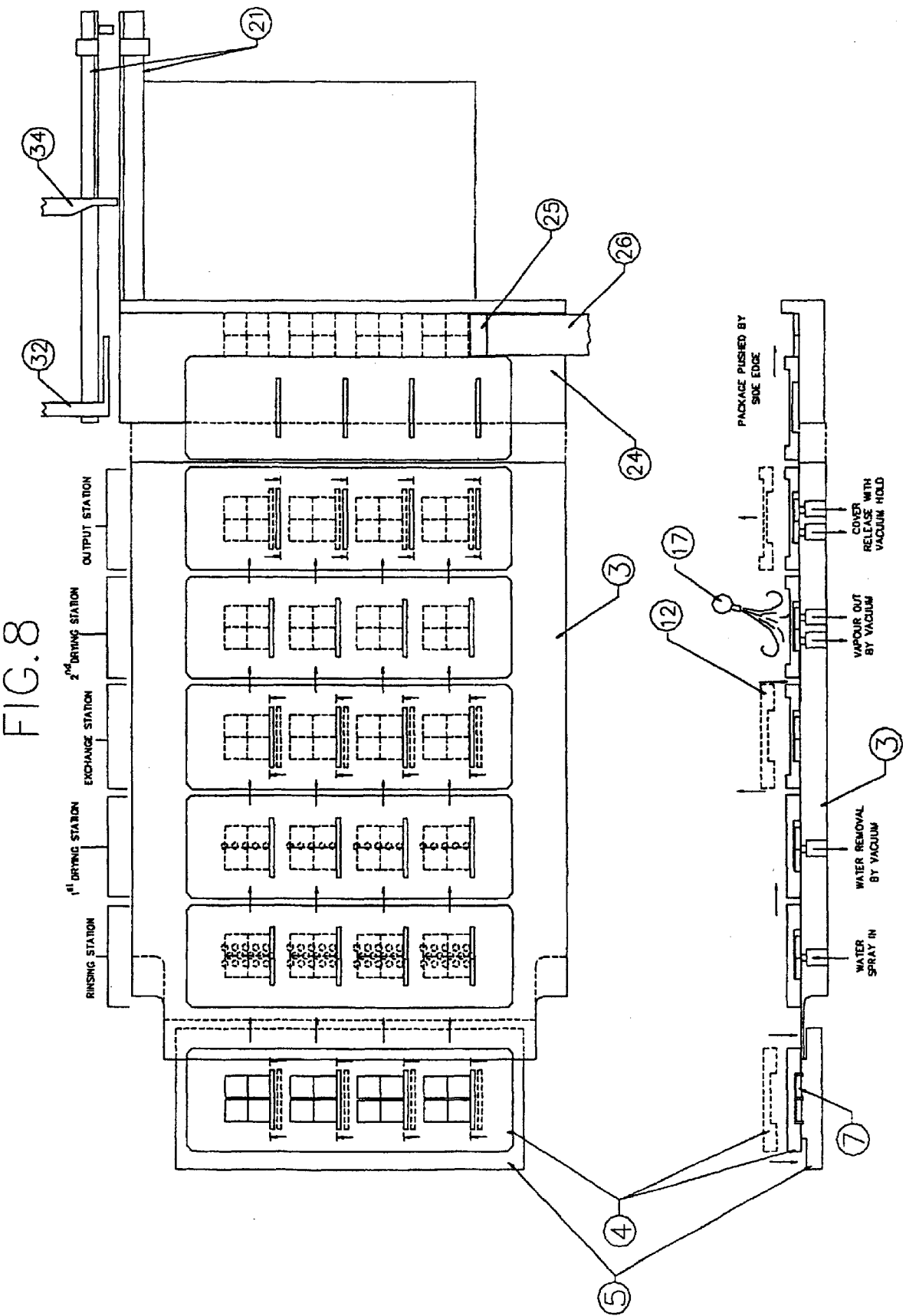

APPARATUS AND METHOD FOR PICK AND PLACE HANDLING

This is a continuation in part application under 35 U.S.C. §§119 and/or 365 to Ser. No. 09/814,217 filed in the United States on Mar. 22, 2001 now ABN; the entire content of which is hereby incorporated by reference.

FIELD OF THE INVENTION

This invention relates to an apparatus and method for the pick and place handling of high density electronic packages, and in particular to the handling of such packages after they have been separated and through subsequent processing.

1. Background of the Invention

High density electronic packages are conventionally formed in rectangular arrays on a common substrate. The electronic packages must then be separated before proceeding to subsequent treatment and processing steps. This separation is conventionally done by a saw that cuts the substrate between the packages while the substrate is held on a cutting chuck by vacuum.

Following the cutting process the electronic packages must undergo a number of processing steps such as cleaning and drying before being transferred for farther operations in the manufacture of desired integrated circuits. In these processing steps it is import that the orientation of the electronic packages is not changed because many of the further operations may be designed depending on a particular orientation of an electronic package. It is important therefore that after separation and during the subsequent processing the electronic packages are kept in the same relative configuration and orientation.

2. Prior Art

In the prior art this is conventionally achieved either by "nesting' techniques, or by keeping the separated electronic packages on the vacuum cutting chuck during the further processing. Nesting techniques can be divided into two categories: using bottom nesting carriers, and using top nesting covers. In both cases the separated electronic packages are held in the original configuration and orientation by either a carrier from below or a cover applied from above—a so-called "nest"—and the packages are held within the nest during further processing. U.S. Pat. Nos. 6,165,232 and 6,187,654 describe such techniques.

An alternative technique is simply to keep the separated packages on the vacuum cutting chuck during subsequent processing such as washing and drying. A difficulty here, however, is that this means that during this further processing the cutting chuck is not available to receive other substrates for separation and if the processing speed of the apparatus is to be acceptable multiple cutting chucks must be provided.

SUMMARY OF THE INVENTION

According to the present invention there is provided apparatus for handling and processing electronic components that have been separated from a common substrate at a cutting chuck, comprising: means for transferring said separated components from said cutting chuck to and through a processing unit, wherein said transferring means comprises at least one opening defined by a plurality of walls for receiving a plurality of said separated components, wherein at least one of said walls is movable to engage said separated components received within said opening and to hold said separated components in a fixed relative orientation.

Viewed from another aspect the present invention provides apparatus for the handling of electronic components formed on a common substrate, comprising: (a) a cutting chuck for separating said components, (b) a processing unit comprising a rinsing station, at least one drying station, and an output station, (c) a transfer platform for receiving components from said output station of said processing unit, and (d) an output track for carrying said components to an output location.

Viewed from a still further broad aspect the present invention provides apparatus for transferring a plurality of electronic components that have been separated from a common substrate, said apparatus comprising at least one opening defined by a plurality of walls for receiving a plurality of said separated components, wherein at least one of said walls is movable to engage said separated components received within said opening and to hold said separated components in a fixed relative orientation.

The invention also extends to methods for handling components, and thus viewed from a further aspect the present invention provides a method for handling and processing electronic components formed on a common substrate, comprising the steps of: (a) separating said components at a cutting chuck, (b) transferring said components by means of a transferring means to and through a processing unit, (c) transferring said components from an output station of said processing unit to a transfer platform, and (d) moving said components from said transfer platform to an output track, and (e)carrying said components along said output track to an output location, wherein steps (b) and (c) are carried out by a lateral sliding motion of said components over level surfaces of said cutting chuck, said processing unit and said transfer platform.

BRIEF DESCRIPTION OF THE DRAWINGS

An embodiment of the invention will now be described by way of example and with reference to the accompanying drawings, in which:

FIG. 1a shows plan and side views of an embodiment of the invention in a condition immediately after separation of the electronic packages on cutting chuck, FIG. 1b shows plan and side views of the embodiment of FIG. 1 after lateral transfer of the separated packages away from the cutting chuck, FIG. 1c shows in plan and side views separated packages received within the transferring means of the present invention prior to engagement with the separated packages, FIG. 1d shows in plan and side views separated packages received within the transferring means of the present invention following engagement with the separated packages, FIG. 2a shows in plan and side views the transfer of the separated packages to a rinsing station, FIG. 2b shows in plan and side views the drying of the separated packages at a first drying station and their transfer to a second transferring means, FIG. 3a shows in plan and side views the transfer of the separated packages to a second drying station, FIG. 3b shows in plan and side views the transfer of the separated packages to an output location, FIG. 4a shows in plan and side views the removal of the transferring means, FIG. 4b shows in plan and side views the use of the transferring means to move the separated packages onto an output means, FIGS. 5a–d show in sequence in plan and side views the operation of the output means, FIGS. 6a–d shows in detail the transfer by the output means of packages to a track, FIGS. 7a and b show the separated packages being moved along the track to a pick-up location, and FIG. 8 shows plan and side views of the complete apparatus.

DETAILED DESCRIPTION OF PREFERRED EMBODIMENT

Figure 7B:
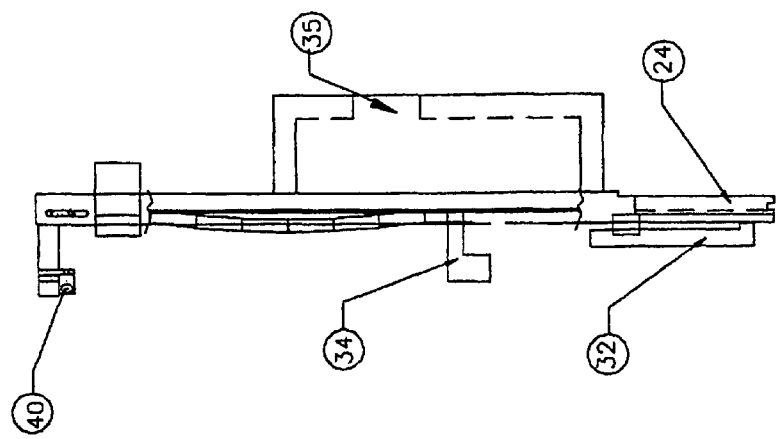

Referring firstly to FIGS. 1a and b, a substrate bearing a plurality of electronic packages is placed on a vacuum cutting chuck 5. As can be seen particularly in FIG. 1b, the cutting chuck 5 includes a rectangular array of cutting recesses 9 that allow a cutting saw (not shown) to separate the individual electronic packages 7 from each other. The cutting chuck 5 is also formed with vacuum holes 8 located at each electronic package to hold firstly the entire substrate, and then after separation the individual packages 7, onto the chuck 5. In the embodiment shown a total of 16 electronic packages are formed on the substrate and are divided and separated into four groups of four. It will be understood that other numbers and arrangements are possible.

Following separation of the electronic packages 7 from each other, and while the packages 7 remain held by vacuum on the cutting chuck 5, a first transferring means 4 is moved to a position directly over the cutting chuck 5 and the separated packages 7. The transferring means 4 comprises a generally rectangular metal frame and (in this example) four generally rectangular openings bounded on four sides and corresponding to the four groups of electronic packages 7, but slightly larger then the space occupied by the groups of packages 7. The first transferring means 4 is then lowered onto the cutting chuck 5 so that the groups of separated packages 7 are received within the openings.

The openings are defined by four walls, two walls 1 parallel to the longitudinal axis of the transferring means 4, and two walls 2 transverse to the longitudinal axis. At least one of these walls is movable by an actuator so as to engage the separated packages 7 and move them together so that they are held in contact with each other in order to maintain their relative positions and orientations. In the embodiment of FIGS. 1a and b it is one of the transverse walls 2 that is movable and FIGS. 1a and b show the movement of this wall 2 along the longitudinal axis of the transferring means so as to move the packages 7 into engagement with each other.

It should also be noted that across the openings are provided cross-wires 6 that form a mesh serving to prevent any of the packages 7 from overlapping with each other. The height of the transferring means 4 defined by the guiding frame 16 (FIG. 1c) has to be selected low enough to enable the wires 6 to serve this function to prevent overlapping, but high enough so that the wires are not in unnecessary contact with the packages 7 potentially damaging them. A soft material is chosen for the cross-wires 6 to minimize the potential for damage.

In FIGS. 1a and b only one of the walls, a transverse wall 2, is movable, but in the embodiment of FIGS. 1c and d both a transverse wall 2 and a longitudinal wall 1 may be movable. An actuator 43 serves to move the transverse walls 2 of each opening, while an actuator 44 likewise moves the longitudinal walls 1 of each opening.

Once one or more of the walls 1,2 has moved so that the packages 7 in each group are moved into engagement with each other, the transferring means 4 is moved laterally so that the packages are slid onto a processing unit 3. The upper surface of the processing unit 3 lies flush with the upper surface of the cutting chuck 5 so that the packages may be slid smoothly onto the processing unit 3. The processing unit has a single smooth top surface 3 within which are formed five processing stations: a rinsing station, a first drying station, an exchange station, a second drying station, and an output station. These five stations will now be considered in turn.

FIG. 2a shows the rinsing station. At the rinsing station there is formed a series of holes 10 in a line that lies beneath the packages 7 along the longitudinal axis of the transfer means 4 and the groups of packages 7. Water or any other desired rinsing medium may be supplied to the undersides of the packages 7 while the packages 7 are held at the rinsing station by the transferring means 7. During this rinsing operation the transferring means 4 is moved from side to side as shown by the arrows in FIG. 2a to ensure that water or whatever rinsing medium is used is applied to the complete undersurfaces of the packages 7. It should be noted here that the upper sides of the packages 7 would conventionally have already been rinsed as part of the separation operation at the cutting chuck or by other mechanism on the rinsing station.

Following rinsing of the packages 7 at the rinsing station, the transferring means 4 is moved laterally again to slide the packages 7 over the surface 3 of the processing unit until the packages 7 are located at a first drying station defined by two rows of vacuum holes 11 that are connected to a vacuum source so as to hold the packages 7 onto the surface 3 of the processing unit. While the packages 7 are being held onto the surface 3 by the vacuum holes 11, the first transferring means 4 is moved laterally over the vacuum holes 11 as shown by the arrows and the vacuum holes 11 serve to dry the undersurfaces of the packages 7 and to remove any liquid from the undersurfaces that may have either from the rinsing performed on the cutting chuck or by the rinsing of the surfaces at the rinsing station.

The first transferring means is then moved laterally to an exchange station at which the first transferring means 4 is replaced by an identical second transferring means 12. At this exchange station the first transferring means 4 moves upwardly away from the packages 7, and is then moved laterally back towards the cutting chuck 5 to repeat its operation with a further substrate and groups of separated packages. In its place an identical second transferring means 12 is moved laterally over the packages 7 and then down over the packages 7 to take the place of the first transferring means 4.

It should be noted here that in principle the second transferring means 12 is not essential and all the transferring operations could be performed by the first transferring means 4. However, it is preferable to provide a second transferring means 12 to replace the first transferring means 4 so that the first transferring means 4 is free to go back to the cutting chuck 5 in order to transfer further separated packages. Providing the second transferring means thus speeds up the processing time of the apparatus. The structures longitudinal wall 15, transverse wall 13 and the cross-wires 14 in the second transferring means 12 are the counterparts of longitudinal wall 1 and transverse wall 2 and the cross-wires 6, respectively, in the first transferring means 4.

From the exchange station the second transferring means 12 then slides the packages 7 laterally to a second drying station shown in FIG. 3a where the packages 7 are held on the platform of the processing unit by vacuum holes 19. At the second drying station a drying means 17 directs air onto the packages 7 through a plurality of nozzles (preferably one nozzle per group of packages). Both the second drying means 17 and/or the second transferring means 12 may move laterally to ensure that the packages 7 are fully dried, and the drying means 17 may also move along the axis of the transferring means 12 (i.e. normal to the direction of movement of the transferring means 4,12 through the processing unit).

FIG. 3b shows the final stage on the processing unit where the packages 7 are slid by the second transferring means 12 from the second drying station to an output station at which the packages 17 are held by vacuum holes 20. At this output station the packages 7 are held by the vacuum holes 20 while the second transferring means 12 is lifted away from the packages and then moved laterally back to a position between the packages 7 and the drying means 17 before being lowered to the surface 3 of the processing unit. When lowered onto the surface 3 of the processing unit, the second transferring means 12 is then behind (in relation to the direction of movement of the packages through the processing unit) and further sliding movement of the second transferring means 12 as shown in FIGS. 4a and b using side edge 18 pushes the packages 7 onto a transfer platform 24 where the packages are held by vacuum holes 23. The second transferring means 12 pushes the packages until they come up against a wall 22 that extends parallel to the longitudinal axis of the second transferring means 12 and the packages are then sandwiched between the wall 22 and a longitudinal side edge 18 of the second transferring means 12. In this position movement of the second transferring means is stopped.

From the transfer platform 24 the packages are then moved onto a track 21 by the sequence illustrated in particular in FIGS. 5a–d. In this movement the packages 7 are moved in a direction parallel to the longitudinal axis of the groups of packages and the transferring means 4,12, and thus transverse to the direction of movement of the packages through the processing unit.

Firstly, as shown in FIG. 5a a pusher 25 is lowered in front of the packages 7 between the packages 7 and the track 21. The pusher 25 is then moved backwardly as shown in FIG. 5b until the groups of packages 7 are moved together so that the spaces between them are removed, and importantly so that the front edges of the foremost packages 7 (i.e. those closest to the track 21) are aligned with each other. This is the position shown in FIG. 5b. From this position the pusher 25 is then raised and moved to the back of the packages (i.e. furthest away from track 21) where it is lowered to a position between the packages 7 and a cover 26. From this position the pusher 25 pushes the packages 7 towards the track 21 as shown in FIG. 5c. During this operation the vacuum holes 23 serve to prevent buckling of the row of packages as might otherwise happen as shown in FIG. 5d. Furthermore the cover 26 prevents unwanted wastage of suction through the vacuum holes 23 that are exposed as the pusher 25 pushes the row of packages 7 towards the track 21. In this way the suction in the cavity 30 is concentrated where it is needed and this reduces the power of the suction means 29 that is necessary. The vacuum suction provided by vacuum source 27 and vacuum source 28 acts as brakes for the foremost packages 7. This can eliminate the gaps between adjacent rows of packages 7 on the transfer platform 24 when the pusher 25 pushes the packages 7 towards the track 21.

Referring now to FIGS. 6a–d it will be seen that the track 21 is at a slightly lower level than the transfer platform 24. This is used to enable the packages 7 to be cleanly separated from the row behind as they are moved from the platform 24 to the track 21. To achieve this there is provided a second pusher 32 located over the part of track 21 adjacent the end of platform 24. A sensor 33 positioned directly over the junction between the end of the platform 24 and the track 21, and sensor 33 is adapted to detect the packages 7 as they move along the platform 24 towards the track 21. In particular the first pair of packages 7 is allowed to be pushed by pusher 25 beyond the end of the platform 24, but when the packages 7 are pushed to ~90% onto the track 21 (FIG. 6b). The center of gravity of the packages 7 is well beyond the edge of the transfer platform 24 but one side of the packages 7 is still on the transfer platform 24. The pusher 25 is stopped briefly and second pusher 32 moves downwardly gently (FIG. 6c) to break the first pair of packages away from the second pair and onto the track 21. After the breakage, the second pusher 32 moves upward to its original position. The pusher 25 pushes the foremost packages 7 totally onto the track 21 as the sensor 33 detects the edges of next pair of packages reaching the end of the platform 24 (FIG. 6d). The falling action of the packages 7 is assisted by the vacuum suction provided by the vacuum holes 31 underneath the track 21. The second pusher 32 moves down on top of the packages 7 on the track 21. The height of the heel of the second pusher 32 is designed in a way that when it is at down position, bottom rubber surface of the pusher will not press onto the packages 7 on the track 21. The packages 7 on the track 21 are then moved away by the heel of the second pusher 32. The second pusher will return to its up position and back to the location adjacent the end of platform 24 after this push action on the packages 7. The pusher 25 is restarted so that the process can continue.

Figure 7A:
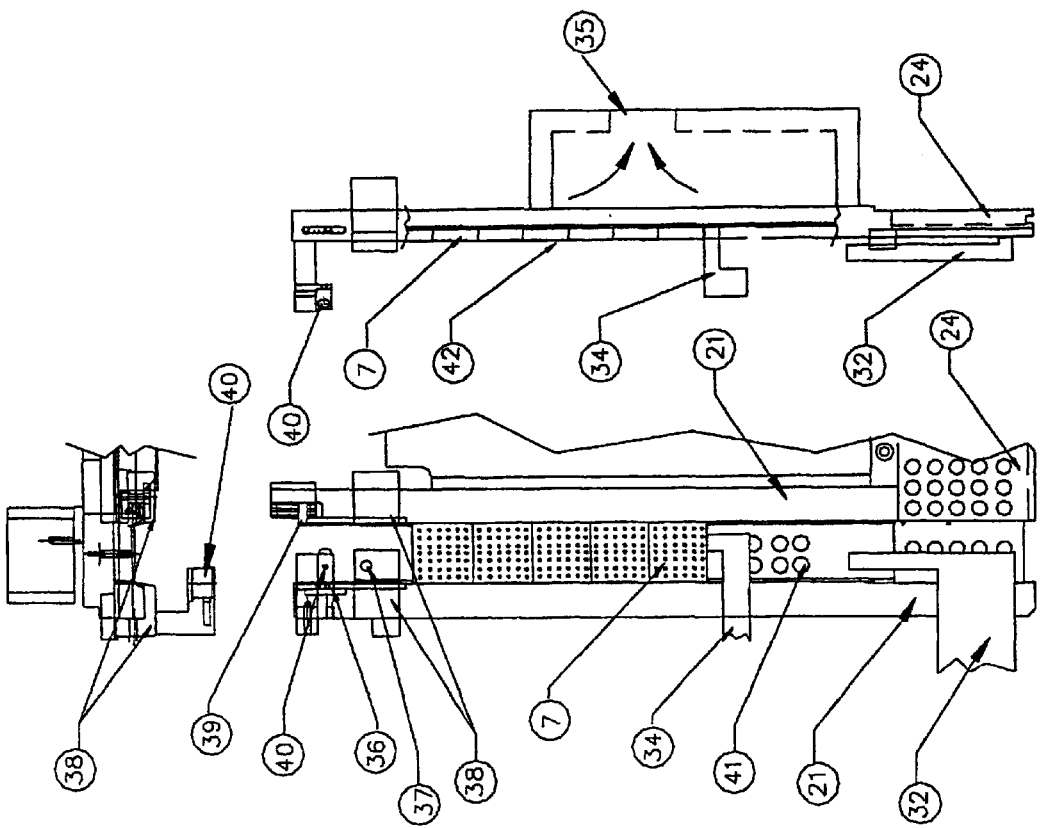

When a certain number of the packages 7 have been moved in this way from the transfer platform 24 onto the track 21, a third pusher 34 is moved to a position behind the packages 7 to push the packages 7 towards the end of the track 21 and an output position from which the packages 7 may be picked-up by pick-and-place apparatus for vision inspection and further processing and assembly into integrated circuit boards in conventional manner. FIGS. 7a shows this process. The vacuum holes 41 underneath the track 21 serve to prevent buckling of the packages 7 as might otherwise happen as shown in FIG. 7b.

The third pusher 34 pushes the row of packages 7 along the track 21 until the first package 7 of the row reaches a vacuum hole 37 at which point it will be held by the vacuum hole 37 until all the spaces between the packages 7 are eliminated and the third pusher 34 acts through the row of packages 7 to push the packages onward until the leading edge of the first package 7 in the row is detected by an optical sensor 40 provided at the end of the track. When the sensor 40 detects the leading edge of the first package of the row, the third pusher 34 is stopped. Lateral vacuum hole 36 also acts to brake the first package to prevent any overshoot or continued motion due to inertia, and a micro-mechanical stopper 39 acts as a back-up. When the first package 7 is thus stopped at the output position at the end of the track, a conventional pick head (not shown) removes the package from below and carries it away for further handling in any conventional manner. While the first package is being picked by the pick head, the next package in line is held by vacuum hole 37 and stopper 38 prevents any accidental lifting of the next package when the first package is being picked.

Once the first package has been picked, the third pusher 34 is reactivated to push the row of packages 7 until the leading edge of the next package 7 is detected by the optical sensor 40 and the previous steps are then repeated.

FIG. 8 shows in plan and side views the overall apparatus and process involved in this embodiment of the invention.

The substrate bearing the packages 7 is separated on a cutting chuck 5, then transferred in sequence to a rinsing station, a first drying station, an exchange station at which a first transferring means is replaced by a second transferring means, a second drying station and finally an output station from which the packages are moved onto a transfer platform. The upper surfaces of the cutting chuck 5, processing unit 3, and transfer platform 24 are all in the same plane and the packages 7 are transferred from the cutting chuck 5, through the processing unit and onto the transfer platform 24 by a lateral sliding movement over the top surfaces. From the transfer platform 24 the packages are moved to a track 21 at a low level which then takes them to an output position.

What is claimed is:

1. Apparatus for handling and processing electronic components that have been separated from a common substrate at a cutting chuck, comprising: means for transferring said separated components from said cutting chuck to and through a processing unit, wherein said transferring means comprises at least one opening defined by a plurality of walls for receiving a plurality of said separated components, wherein at least one of said walls is movable to engage said separated components received within said opening and to hold said separated components in a fixed relative orientation.

2. Apparatus as claimed in claim 1 wherein two mutually orthogonal walls are movable to engage and hold said components.

3. Apparatus as provided in claim 1 wherein a plurality of wires extend across the top of said opening.

4. Apparatus as claimed in claim 1 wherein an exchange station is provided at which a first transferring means is exchanged for a second transferring means whereby said first transferring means may return to said cutting chuck to collect further components while said separated components are subsequently transferred by said second transferring means.

5. Apparatus as claimed in claim 1 wherein said processing unit comprises a rinsing station, at least one drying station and an output station.

6. Apparatus as claimed in claim 5 wherein said processing unit comprises two drying stations.

7. Apparatus as claimed in claim 5 wherein said rinsing station comprises a plurality of rinsing medium supply holes through which a rinsing medium may be supplied to the undersurface of said components as said components are held at said rinsing station by said transferring means.

8. Apparatus as claimed in claim 7 wherein said holes are arranged in a line and said transferring means is adapted to move transverse with respect to said line to ensure said rinsing agent is applied over substantially all the undersurfaces of said components.

9. Apparatus as claimed in claim 5 wherein a first drying station comprises a row of vacuum holes arranged in a line whereby liquid is drawn from said components by suction.

10. Apparatus as claimed in claim 5 wherein a second drying station comprises means for supplying air to top surfaces of said components.

11. Apparatus as claimed in claim 10 wherein said air supplying means comprise nozzles arranged in a line and said transferring means is adapted to move transverse with respect to said line to ensure air is supplied from said nozzles over substantially all the entire surfaces of said components.

12. Apparatus as claimed in claim 5 wherein said stations are formed as part of a surface of said processing unit and said components are transferred between said stations by said transferring means by means of a lateral sliding movement across said surface.

13. Apparatus as claimed in claim 5 wherein a transfer platform is provided for receiving components from said output station, the surface of said transfer platform being level with the surface of said processing unit.

14. Apparatus as claimed in claim 13 wherein at said output station said transferring means is moved to a position immediately upstream of said components to push said components from said output station onto said transfer platform.

15. Apparatus as claimed in claim 1 wherein said transferring means transfers said components from said cutting chuck to said processing unit by means of a lateral sliding movement of said components.

16. Apparatus as claimed in claim 1 wherein a transfer platform is provided for receiving components from said processing unit.

17. Apparatus as claimed in claim 1 wherein said transfer platform is provided with means for moving said components received thereon to an output track means.

18. Apparatus as claimed in claim 17 wherein the direction of movement of said components on said transfer platform is transverse to the direction of movement of said components through said processing unit.

19. Apparatus as claimed in claim 17 wherein said moving means comprises a first pusher means.

20. Apparatus as claimed in claim 19 wherein said pusher means is provided to push the said components forwards towards said output track and backward on the said transfer platform, said pusher means being able to move up and down vertically and back and forward laterally.

21. Apparatus as claimed in claim 17 wherein said components are held on said transfer platform by vacuum holes.

22. Apparatus as claimed in claim 21 wherein said vacuum holes are provided to prevent buckling of said components on said transfer platform during their movement.

23. Apparatus as claimed in claim 21 wherein cover means is provided to cover any said vacuum holes on said transfer platform that are upstream of said components as the said components are moved towards said output track.

24. Apparatus as claimed in claim 17 wherein the surface of said output track means is at a lower level than said transfer platform.

25. Apparatus as claimed in claim 24 wherein means are provided for detecting when a leading said component reaches the output track, means are provided for stopping the movement of said components towards said track when said leading component reaches said track, and wherein a second pushing means is provided adapted to push down on said leading component as it reaches said output track.

26. Apparatus as claimed in claim 25 wherein said detecting means is an optical sensor provided on said second pushing means.

27. Apparatus as claimed claim 17 wherein said output track carries said components to an output location where said components are picked by a pick head.

28. Apparatus as claimed in claim 27 wherein a third pushing means is provided for moving said components along said track.

29. Apparatus as claimed in claim 28 wherein means are provided for detecting the arrival of a leading component at said output location and for stopping said third pushing means when the arrival of said leading component is detected by an optical sensor.

30. Apparatus as claimed in claim 27 wherein vacuum holes are provided to prevent buckling of said components in said track during movement.

31. Apparatus for the handling of electronic components formed on a common substrate, comprising:
  (a) a cutting chuck for separating said components,
  (b) a processing unit comprising a rinsing station, at least one drying station, and an output station,
  (c) a transfer platform for receiving components from said output station of said processing unit, and
  (d) an output track for carrying said components to an output location.

32. Apparatus as claimed in claim 31 wherein the upper surfaces of said cutting chuck, said processing unit and said transfer platform are at the same level, and wherein the apparatus further includes transfer means for transferring said components from said cutting chuck through said processing unit to said transfer platform by a sliding motion across the surfaces of said cutting chuck, processing unit and transfer platform.

33. Apparatus as claimed in claim 32 wherein said processing unit comprises an exchange station at which a first transferring means is replaced by a second transferring means.

34. Apparatus as claimed in claim 32 wherein said transferring means comprises at least one opening defined by a plurality of walls for receiving a plurality of said separated components, wherein at least one of said walls is movable to engage said separated components received within said opening and to hold said separated components in a fixed relative orientation.

35. Apparatus as claimed in claim 31 wherein an optical sensor to detect the separation of row of said components is mounted at the position directly over the junction between the end of said transfer platform and said output track.

36. Apparatus as claimed in claim 31 wherein an optical sensor to detect the leading edge of the first said component is mounted at said output location.

37. Apparatus as claimed in claim 31 wherein an vacuum holes provide vacuum suction for damping and mechanical stoppers are installed at said output location to stop the first said component at the right position ready for pickup.

38. Apparatus for transferring a plurality of electronic components that have been separated from a common substrate, said apparatus comprising at least one opening defined by a plurality of walls for receiving a plurality of said separated components, wherein at least one of said walls is movable to engage said separated components received within said opening and to hold said separated components in a fixed relative orientation.

39. A method for handling and processing electronic components formed on a common substrate, comprising the steps of:
  (a) separating said components at a cutting chuck,
  (b) transferring said components by means of a transferring means to and through a processing unit,
  (c) transferring said components from an output station of said processing unit to a transfer platform, and
  (d) moving said components from said transfer platform to an output track, and
  (e) carrying said components along said output track to an output location, wherein steps (b) and (c) are carried out by a lateral sliding motion of said components over level surfaces of said cutting chuck, said processing unit and said transfer platform.

40. A method as claimed in claim 39 wherein said components are transferred from said cutting chuck to said processing unit, through said processing and unit and to said transfer platform in a first direction, and wherein said components are transferred along said transfer platform to said output track in a second direction normal to said first direction.

41. A method as claimed in claim 40 wherein said components are carried along said output track in a direction parallel to said first direction.

42. A method as claimed in claim 39 wherein in step (b) said transferring of said components is done by a transferring means comprising at least one opening defined by a plurality of walls for receiving a plurality of said separated components, wherein at least one of said walls is movable to engage said separated components received within said opening and to hold said separated components in a fixed relative orientation.

43. A method as claimed in claim 39 wherein in step (d) said components are held to said transfer platform by vacuum holes, and the vacuum holes upstream of said components are covered as the components move forward toward said out put track.

44. A method as claimed in claim 39 wherein in step (d) prior to moving said components to said output track, the edges of the leading components are aligned and all gaps between said components are eliminated.

45. A method as claimed in claim 39 wherein in step (d) a downward pressure is applied to said components as they move from said transfer platform to said output track by using multiple pushes action and with the assistance of vacuum suction from the vacuum holes underneath said output track.

46. A method as claimed in claim 45 wherein the first push is applied to said components to push them substantially onto said track, such that the center of gravity of the said component is well beyond the edge of the said transfer platform but one side of the said component is still on the said transfer platform, by said pusher and a gentle downward pressure is applied to said components by said second pusher to ensure the total separation of said components from the row behind them, wherein a second push is applied to said components to push them totally onto said track by said pusher, and wherein the falling action of said components is assisted by said vacuum suction provided by said vacuum holes underneath said output track.

47. A method as claimed in claim 39 wherein in step (e) said components are held on said output track by vacuum holes as said components move along said output track towards the output location and stop there.

48. A method as claimed in claim 47 wherein said components are pushed along the said output track and stopped at said output location with the assist of damping provided by vacuum suction and mechanical stopper.

* * * * *